United States Patent [19]

Roy et al.

[11] 3,965,441

[45] June 22, 1976

[54] PARALLEL RESONANT CIRCUIT WITH FEEDBACK MEANS FOR INCREASING Q

[75] Inventors: Neal L. Roy, Redondo Beach; David O. Hansen, Oakland, both of Calif.

[73] Assignee: TRW Inc., Redondo Beach, Calif.

[22] Filed: June 20, 1975

[21] Appl. No.: 588,760

[52] U.S. Cl. ............................ 331/115; 331/117 R; 333/80 T
[51] Int. Cl.² ........................................ H03B 7/06
[58] Field of Search .......... 331/115, 117, 132, 168, 331/108 D; 330/107; 333/80 R, 80 T

[56] References Cited
UNITED STATES PATENTS 3,470,500  9/1969  Orchard et al. ........................ 333/80

Primary Examiner—John Kominski
Attorney, Agent, or Firm—Daniel T. Anderson; Jerry A. Dinardo; Edwin A. Oser

[57] ABSTRACT

In a parallel resonant circuit having an inductor connected in parallel with a capacitor, a sensing resistor is connected in series with the inductor to sense the current in the resonant circuit. The voltage drop across the sensing resistor is applied to an operational amplifier and the amplified output voltage is fed back to the circuit loop out of phase with the sensed voltage drop so as to reduce the effective circuit resistance and thereby increase the circuit Q.

5 Claims, 5 Drawing Figures

PARALLEL RESONANT CIRCUIT WITH
FEEDBACK MEANS FOR INCREASING Q

BACKGROUND OF THE INVENTION

This invention relates to resonant circuits and particularly to active means for not only varying the Q of an inductor but also increasing it far beyond that value of a Q which is normally considered as the inherent maximum of the passive components.

The figure of merit Q of a resonant circuit at a frequency $f$, containing inductance and capacitance is defined by the relationship $Q = \omega L/R$, where $\omega = 2\pi f$, $L$ is the circuit inductance, and R is the net circuit resistance. In most cases the capacitors used in resonant circuits are non-dissipative at low frequencies relative to other losses which may exist in the circuit, so for all practical purposes the resistance R is primarily that of the inductor windings.

As the frequency of a resonant circuit is lowered it becomes increasingly difficult to obtain the high Q values which are enjoyed at higher frequencies. This arises because the inductive reactance $\omega L$ decreases in direct proportion to frequency while the circuit resistance R remains unchanged or may actually rise as inductors with larger windings are used. As a result of this generally lower Q, frequency selective LC circuits perform poorly at frequencies below about 100 kH$_z$.

According to the present invention, active circuit means are provided which dramatically reduce the problem of low Q at frequencies below about 100 kH$_z$. The circuits utilized permit the Q of an inductor to be made variable and increased far beyond that normally considered to be the inherent maximum of the passive components. The resulting circuit improvement over the prior art should find application in such areas as receiving equipment, filter systems, and frequency selective equipment operating at low frequencies.

SUMMARY OF THE INVENTION

In order to increase the Q of an inductor or resonant circuit, the power losses in the circuit must be reduced. The losses are primarily resistor losses, especially at low frequencies; however, some losses obviously result from radiation and magnetic coupling to points outside the inductive circuit element. In any event, these losses are related to the total current flowing in the circuit. The desideratum, therefore, is to sense the magnitude of the circuit current and then inject power into the circuit in a manner which will directly offset and cancel the losses arising from the current circulating through the dissipative elements.

In accordance with one embodiment of the invention, a capacitor and an inductor are arranged in a parallel resonant circuit with a first side of each thereof connected in common and with a resistor connected in series with the second side of the inductor to sense the current in the resonant circuit. An operational amplifier has its non-inverting input terminal connected to the side of the resistor that is connected in common with the inductor, and has the inverting input terminal connected to the opposite side of the resistor. The output terminal of the operational amplifier is connected to the second side of the capacitor. The operational amplifier senses the voltage drop across the series resistor and feeds back a proportionately greater voltage in opposition thereto, which has the effect of introducing a corresponding negative resistance that is greater than that of the series resistor. The negative resistance has the effect of reducing at least the greater part of the inherent resistance of the inductor and thereby increases the Q correspondingly.

The negative resistance fed back can be adjusted in magnitude to exceed the sum of the resistance of the inductor and the series resistor so that the circuit becomes an oscillator.

DESCRIPTION OF THE PREFERRED EMBODIMENT

Figure 1:
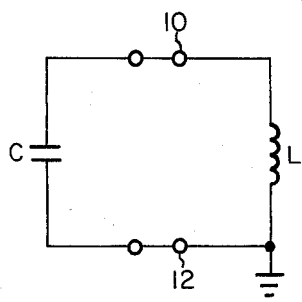
FIG. 1 is a schematic diagram of a conventional parallel resonant LC circuit.

The conventional parallel resonant LC circuit shown in FIG. 1 includes an inductor L and capacitor C connected in parallel across a pair of terminals 10 and 12, one of the terminals 12 being connected to the circuit common or ground connection. Not shown in FIG. 1 is a sizable series resistance inherent in the circuit due principally to the windings of the inductor L.

Figure 2:
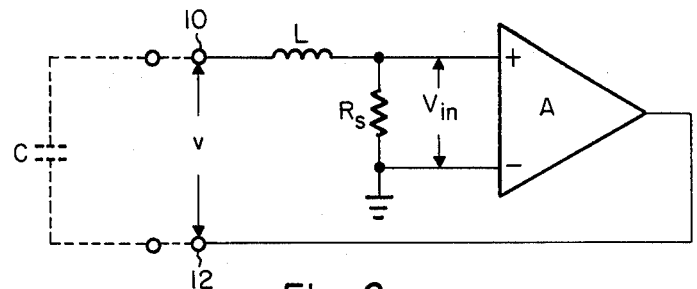
FIG. 2 is a schematic diagram of a parallel resonant LC circuit incorporating means for reducing the effective resistance according to the invention.

In FIG. 2, the parallel resonant circuit of FIG. 1 is modified in accordance with the principles of the invention by incorporating within it means for introducing a negative resistance which serves to reduce the effective resistance in the parallel resonant circuit. For simplifying the discussion, the circuit has been broken at the terminals 10 and 12 and the capacitor C has been shown in phantom to indicate that while it is still part of the resonant circuit, its capacitive reactance does not enter into the equations which will be developed below. The capacitor C can be considered as a voltage source impressing a voltage $v$ across the terminals 10 and 12 for the sinusoidal half cycle during which it drives the inductor L, and during the other half cycle as a load driven by the inductor L.

Referring again to FIG. 2, it will be noted that a current sensing resistor $R_s$ has been inserted in series between the inductor L and ground. In addition, an operational amplifier A having a gain of $\beta$ is connected across the sensing resistor $R_s$, and the output is fed back to the lowermost terminal 12 of the two terminals 10 and 12 carrying the voltage $v$.

Conventional notation is used on the input terminals of the operational amplifier, the + and − signs indicating that if the + input changes with the − input held constant then the output will also change in the same direction as the + input, whereas if the − input changes with the + input held constant, then the output will also change but with the opposite polarity to the − input. Thus, the + terminal is called the non-inverting input and the − terminal is called the inverting input. According to the foregoing convention, therefore, the negative terminal or inverting input of the amplifier A is connected to the grounded end of the sensing resistor $R_s$, and the positive terminal or non-inverting input is connected to the other end of the sensing resistor $R_s$ that is in common with the inductor L.

When current flows in the circuit of FIG. 2, the voltage drop $V_{in}$ that is produced across the sensing resistor $R_s$ is amplified by a factor $\beta$ and the amplified voltage $V_o$ is fed back to the terminal 12 without inversion and thus with the same polarity relative to ground as the input voltage $V_{in}$. Since they have the same polarity relative to ground, the voltages $V_{in}$ and $V_o$ oppose each other in the current loop.

Figure 3:
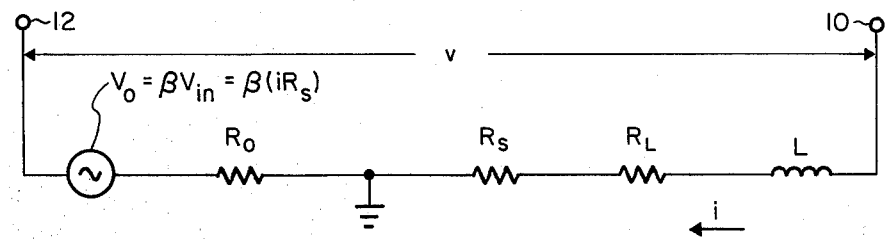
FIG. 3 is the Thevenin equivalent of the circuit of FIG. 2.

The significance of the modified circuitry of FIG. 2 can be seen if one now considers the Thévenin equivalent circuit thereof which is shown in FIG. 3. From FIG. 3, descriptive equations may be developed. The voltage v across the circuit is related to the current i in the circuit by the following equation which simply sums the voltage drops across each of the circuit elements, $R_L$ representing the resistance inherent in the inductor winding, $R_s$ the current sensing resistance, and $R_o$ the amplifier output resistance.

$$v = L\, di/dt + i\, R_L + i\, R_s + i\, R_o - V_o \tag{1}$$

$V_o$ is related to $V_{in}$ and hence the current in the circuit by $$V_o = \beta V_{in} = \beta i\, R_s \tag{2}$$

substituting the value for $V_o$ in Equation (1)

$$v = L\, di/dt + i\, R_L + i\, R_s + i\, R_o - \beta i\, R_s \tag{3}$$

collecting terms, $$v = L\, di/dt + i\, [R_L + R_o + R_s\, (1-\beta)] \tag{4}$$

The above equation (4) for v is valid for any i, but for the purpose of this invention, the case of most interest is for $i = f(t)$ and especially where $i = I_o \sin \omega t$, which will generally be the case for a resonant circuit. If the amplifier gain has negligible phase shift over the frequency of interest, then the gain $\beta$ will be entirely real, that is, containing no reactive components. The bracketed term in equation (4) will then be purely resistive and will constitute the effective resistance in series with the inductor L.

The value of the effective resistance may be varied by changing the magnitude of the series resistance $R_s$ or the gain factor $\beta$. Consider the special case where $R_s$ is made equal to the sum of $R_L$ and $R_o$. In this case the effective resistance of the circuit will be $R_{eff} = R_L + R_o + R_s (1-\beta)$ and will approach zero as the amplifier gain $\beta$ approaches 2.

Since the circuit Q is defined as $Q = \omega L/R_{eff}$, the Q will tend towards infinity as $R_{eff}$ approaches zero.

The above method will be independent of frequency providing the amplifier gain is frequency independent. A stable amplifier gain, independent of frequency is easily attainable with the very low gain factor required. The amplifier's power requirements are minimal since it does not have to amplify the total power flowing in the circuit, but only that portion which represents resistive losses.

Figure 4:
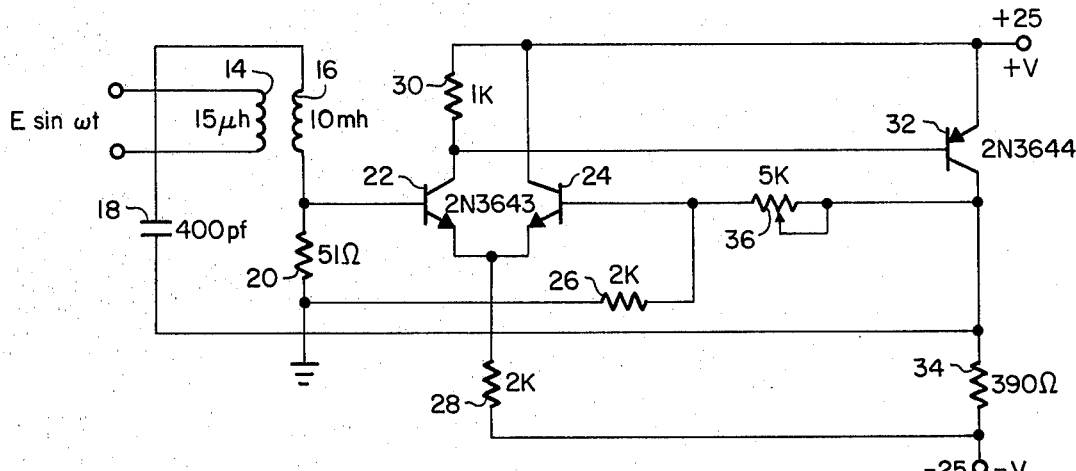
FIG. 4 is a schematic diagram of a more specific embodiment of the circuit of FIG. 2.

A more detailed application of the loss restoration circuitry to a conventional parallel resonant circuit is shown in FIG. 4. In this circuit, a drive signal voltage E sin $\omega t$ is applied to a first inductor 14 and coupled therefrom to a second inductor 16 which forms a parallel resonant circuit with a capacitor 18. A current sensing resistor 20 is in series with the inductor 16 and ground.

The current sensing resistor 20 is connected to a differential amplifier made up of two npn transistors 22 and 24 with their emitters connected in common. The top side of the current sensing resistor 20 is connected to the base input of the first transistor 22, and the grounded side of the resistor 20 is connected through a resistor 26 to the base input of the second transistor 24. The base input of the first transistor 22 is the positive or non-inverting input of the differential amplifier and the base input of the second transistor 24 is the negative or inverting input.

The common emitters of the two transistors 22, 24 are connected through a resistor 28 to a source of negative voltage (−V). The collector of the first transistor 22 is connected through a resistor 30 to a source of positive voltage (+V), and the collector of the second transistor 24 is connected directly to the source of positive voltage (+V). The resistor 28 establishes the standing current through the differential transistors 22, 24.

The collector output of the first transistor 22 is connected to the base input of a pnp output amplifying transistor 32, the emitter of which is connected to the source of positive voltage (+V) and the collector output of which is connected through a load resistor 34 to the source of negative voltage (−V). A portion of the amplified output is fed back to the base input of the second transistor 24 through a variable resistor 36 which together with the base input resistor 26 forms a voltage divider in parallel with the output load resistor 34. By feeding back a portion of the amplified output to the negative or inverting input of the differential amplifier through the variable resistor 36, the circuit is provided with a gain adjust capability as well as gain stability. The open loop voltage gain with the circuit values shown is about 400. The collector output of the amplifying transistor 32 is connected to the capacitor 18 or the base of the parallel resonant circuit to provide the necessary drive signal to restore the circuit losses.

In the operation of the circuit of FIG. 4, if it is assumed that signal current is flowing in the resonant circuit in such a direction as to cause the voltage across the sensing resistor 20 to increase positively then the base of the npn transistor 22 will go positive so as to increase the forward bias on the base emitter junction thereof, increase the collector current and drive the collector output voltage negative. As the collector of the npn transistor 22 goes negative, so does the base of the pnp amplifying transistor 32, thereby increasing the forward bias on the base-emitter junction thereof, increasing the collector current and driving the collector output voltage positive.

Since the positive going output voltage is applied to the capacitor 18 at the base of the resonant circuit, the injected voltage is out of phase with the voltage drops produced across the sensing resistor 20 and the resistance of the inductor 16. The out-of-phase injected voltage has the effect of introducing a negative resistance in the parallel resonant circuit which reduces the resistive losses and increases the Q of the circuit. The negative resistance is controllable by controlling the gain of the operational amplifier.

The inherent Q of the 10 mh inductor 16 was 28 at 25 kHz since it had 56 ohms of series resistance. The circuit of FIG. 4 was found to perform well at circuit Q's exceeding 700 at 25 kHz. This corresponds to an effective series resistance of approximately 2.2 ohms and an effective Q multiplication of 25. The 3 db bandwidth for the above conditions is only 35 Hertz.

To consider the effects only of the circuit elements that are added for loss restoration, the circuit of FIG. 2 can be considered as though the inductance L is removed or short circuited. In such case, an expression can be derived that will describe the effective resistance across terminals 10 and 12 due solely to the sensing resistor and operational amplifier. The voltage across the terminals 10 and 12 then becomes $$v = V_{in} + V_o + iR_s - i\beta R_s = iR_{eff}$$

The effective resistance between terminals 10 and 12 is $$R_{eff} = R_s (1-\beta) \begin{cases} \text{negative for } \beta > 1 \\ 0 \quad \text{for } =1 \\ \text{positive for } \beta > 1 \end{cases}$$

The variable resistance characteristics for $\beta > 1$ may be readily used with reactive components to form an oscillatory system. The amplitude of the oscillations in such a system may be easily controlled by placing a resistance element between the inductance L and capacitance C of the oscillating circuit, the resistance element having a characteristic such that the resistance increases with increasing current.

Figure 5:
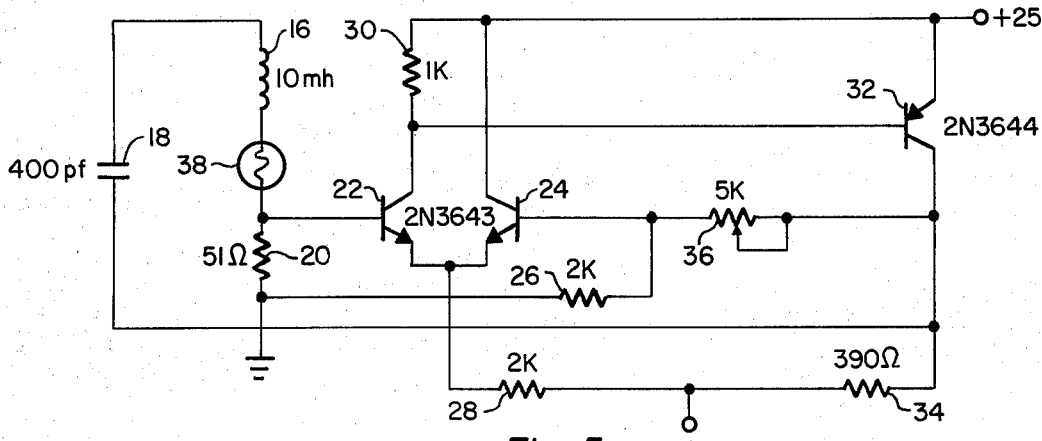
FIG. 5 is a schematic diagram of an oscillator circuit derived from the circuit of FIG. 4.

Referring now to FIG. 5, it can be seen that the circuit of FIG. 4 has been converted into an oscillator by removing the coupling inductor 14 and drive voltage E sin ωt and inserting between the inductor 16 and sensing resistor 20 a resistor, such as an incandescent lamp 38, whose resistance increases with increasing current. The remainder of the circuit of FIG. 5 is the same as the circuit of FIG. 4. It is apparent that if the oscillator output level increases, the current in the tank circuit increases. However, if the resistance of the lamp 38 or other non-linear element increases, the losses in the circuit increase and will tend to return the oscillator level to its original value.

What is claimed is:

1. A parallel resonant circuit, comprising:
   a. a capacitor and an inductor having a first side of each thereof connected in common;
   b. a resistor connected in series with the second side of said inductor to sense the current in said resonant circuit; and
   c. an operational amplifier having its non-inverting input terminal connected to the side of said resistor that is connected in common with said inductor, its inverting input terminal connected to the opposite side of said resistor, and the output terminal connected to the second side of said capacitor;

said operational amplifier serving to introduce a negative resistance into said resonant circuit that is greater than that of said series resistor and thereby to effectively reduce the inherent resistance of said inductor and increase the Q thereof.

2. The invention according to claim 1, and further including means within said operational amplifier for altering the gain thereof to alter the negative resistance.

3. The invention according to claim 1, and further including means within said operational amplifier for adjusting the gain thereof so that the negative resistance is greater in magnitude than the resistances represented by the sum of the resistances of said series resistor and said inductor, whereby said parallel resonant circuit constitutes an oscillatory circuit.

4. The invention according to claim 1, wherein said operational amplifier comprises first and second transistors of a differential transistor pair connected across said sensing resistor, and an amplifying transistor having its input circuit coupled to the output circuit of the first transistor of said differential pair and having its output circuit coupled to said capacitor.

5. The invention according to claim 4, wherein the output circuit of said amplifying transistor is also coupled to the input circuit of the second transistor of said differential pair.

* * * * *